United States Patent  (10) Patent No.: US 7,811,921 B2
Nam et al.  (45) Date of Patent: Oct. 12, 2010

(54) SEMICONDUCTOR DEVICES HAVING A TRENCH IN A SIDE PORTION OF A CONDUCTING LINE PATTERN AND METHODS OF FORMING THE SAME

(75) Inventors: Chang-Hyeon Nam, Gyeonggi-do (KR); Seung-Kun Lee, Gyeonggi-do (KR); Joong-Sup Choi, Seoul (KR); Chang-Moon Ahn, Gyeonggi-do (KR); Wi-Seob Kang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/435,203

(22) Filed: May 4, 2009

(65) Prior Publication Data
US 2009/0215257 A1  Aug. 27, 2009

Related U.S. Application Data

(62) Division of application No. 11/267,176, filed on Nov. 3, 2005, now Pat. No. 7,545,046.

(30) Foreign Application Priority Data

Nov. 5, 2004 (KR) .................. 10-2004-0090063

(51) Int. Cl.
*H01L 21/44* (2006.01)
(52) U.S. Cl. ...................... 438/612; 257/E23.015; 257/E23.02; 257/E23.021
(58) Field of Classification Search ......... 438/581–583, 438/612, 630, 649, 651, 655, 664, 682, 721, 438/755; 257/459, E23.015, E23.02, E23.021, 257/E21.52, E21.59
See application file for complete search history.

(56) References Cited

U.S. PATENT DOCUMENTS

| 5,895,239 A | 4/1999 | Jeng et al. |
| 6,117,733 A | 9/2000 | Sung et al. |
| 6,335,237 B1 | 1/2002 | Tang et al. |
| 2002/0175381 A1 | 11/2002 | Choi et al. |

FOREIGN PATENT DOCUMENTS

| KR | 1998-0005566 | 3/1998 |
| KR | 1999-0061078 | 7/1999 |
| KR | 10-2004-0014065 | 2/2004 |
| KR | 10-2004-0017982 | 3/2004 |

*Primary Examiner*—Davienne Monbleau
*Assistant Examiner*—Monica D Harrison
(74) *Attorney, Agent, or Firm*—Volentine & Whitt, PLLC

(57) ABSTRACT

A semiconductor device having a trench in the side portion of a conducting line pattern and methods of forming the same. The semiconductor device provides a way of preventing an electrical short between the conducting line pattern and a landing pad adjacent to the conducting line pattern. There are disposed two conducting line patterns on a semiconductor substrate. Each of the conducting line patterns includes a conducting line and a conducting line capping layer pattern stacked thereon. Each of the conducting line patterns has a trench between the conducting line capping layer pattern and the conducting line. Conducting line spacers are formed between the conducting line patterns. One conducting line spacer covers a portion of a sidewall of one of the conducting line patterns, and the remaining conducting line spacer covers an entire sidewall of the remaining conducting line pattern. A landing pad is disposed between the conducting line patterns.

16 Claims, 13 Drawing Sheets

SEMICONDUCTOR DEVICES HAVING A TRENCH IN A SIDE PORTION OF A CONDUCTING LINE PATTERN AND METHODS OF FORMING THE SAME

CROSS-REFERENCE TO RELATED APPLICATION

This application is a Divisional of U.S. patent application Ser. No. 11/267,176, filed on Nov. 3, 2005, now pending, which claims priority under 35 U.S.C. §119 from Korean Patent Application No. 10-2004-0090063, filed Nov. 5, 2004, in the Korean Intellectual Property Office, the entire contents of which are hereby incorporated by reference

BACKGROUND OF INVENTION

1. Technical Field

The invention relates to semiconductor devices and methods of forming the same, and more particularly, to semiconductor devices having a trench in a side portion of a conducting line pattern and methods of forming the same.

2. Discussion of the Related Art

A semiconductor fabrication process, in recent years, may employ a landing pad to accomplish high integration of a semiconductor device with a design rule below the submicron scale. The landing pad is formed to extend upward from an upper surface of a semiconductor substrate. The landing pad functions to electrically connect the discrete elements, which are located at different positions inside the semiconductor device. An insulating layer is typically provided between the landing pad and these elements adjacent to the landing pad. The discrete elements located on, or occupying the space around, the upper surface of a semiconductor substrate can be spaced farther from the semiconductor substrate because of the presence of the landing pad. Thus the area of the semiconductor substrate used for a semiconductor device is reduced.

The landing pad, however, due to shortcomings of the semiconductor fabrication process, may have structural problems that tend to cause electrical shorts between the landing pad and the adjacent discrete elements. These shortcomings generally result from fabricating with a reduced design rule. More specifically, this is because the landing pad has a small process margin for aligning discrete elements during the fabrication process.

Working towards a remedy, U.S. Pat. No. 6,335,237 to Sanh D. Tang et al. (the '237 patent) discloses a method of forming a capacitor and bitline structure.

According to the '237 patent, the method includes providing a semiconductor substrate having a plurality of electrical nodes. A stack of bitline materials are formed over at least a portion of the electrical nodes. Each of the bitline materials includes at least one conductive material and at least one insulative material, which are sequentially stacked. Then openings are formed in the electrical nodes through the bitline materials. Conductive masses are respectively formed in the openings. The conductive masses fill at least a portion of the openings.

However, this method has an increased risk of exposing the bitline materials through the openings during the semiconductor fabrication process. This reason for this risk is as follows. The conductive masses are insulated from the bitline materials using insulative spacers as an insulating layer. The insulative spacers are formed on sidewalls of the bitline materials, respectively. The insulative spacers are formed by using an etch process, which is performed on an overall surface of the semiconductor substrate. The etch process may show a non uniform etch rate at some portions of the semiconductor substrate. The insulative spacers may not fully cover the sidewalls of the bitline materials at the portions of the semiconductor substrate. Because of that, the bitline materials cause an electrical short with the conductive masses through the openings at the portions of the semiconductor substrate.

SUMMARY OF THE INVENTION

According to embodiments of the invention, there are provided semiconductor devices having a trench in a side portion of a line pattern on a semiconductor substrate, with a decreased risk of an electrical short between the line pattern and a landing pad adjacent to the line pattern. Methods of forming these semiconductor devices are also provided.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts.

DETAILED DESCRIPTION OF THE INVENTION

In the illustrated embodiments, bit lines are described, but embodiments of the invention are not limited to bit lines, but also include general conducting lines and so on.

Figure 1:
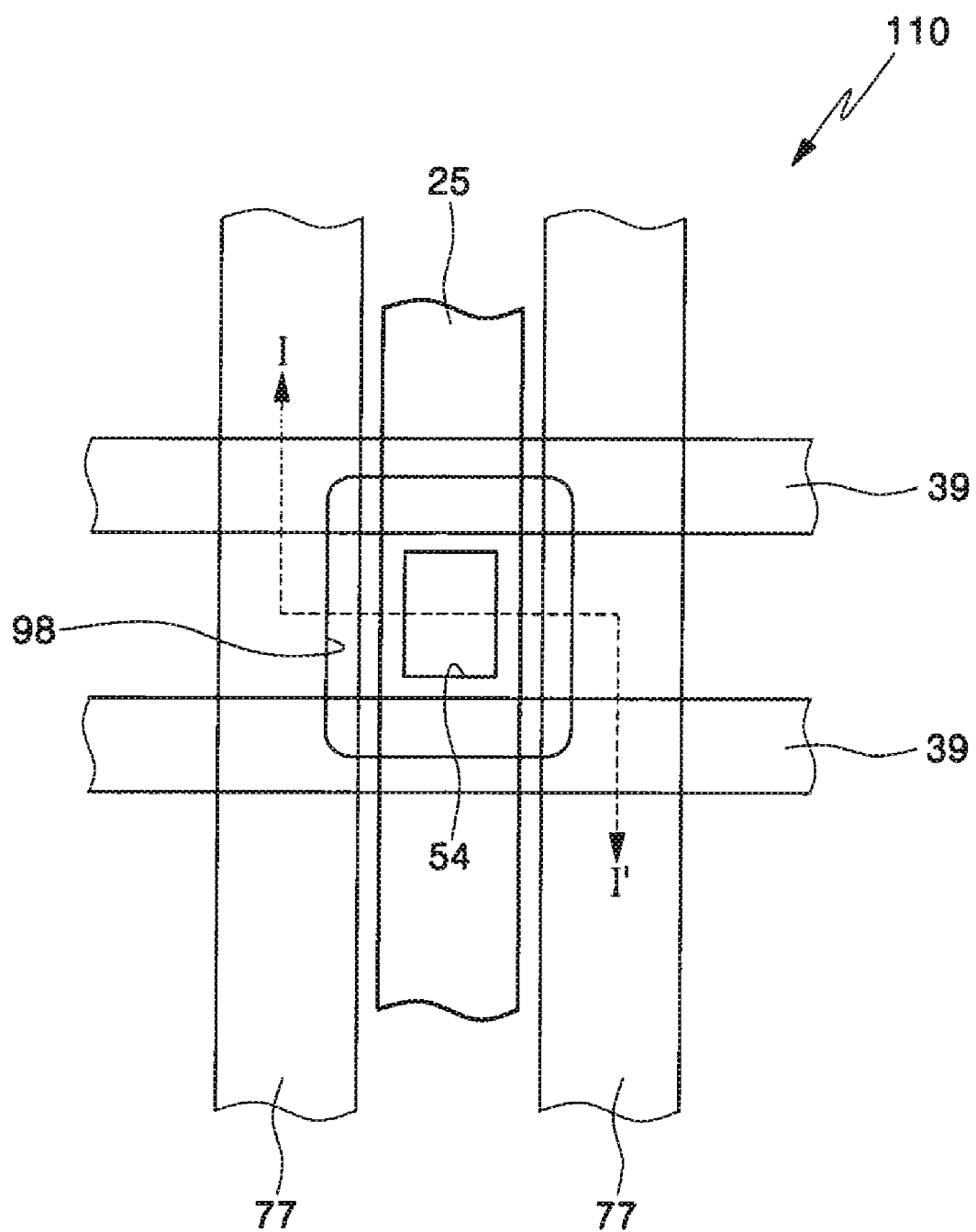
FIG. 1 is a layout showing a semiconductor device according to the invention.
Figure 2:
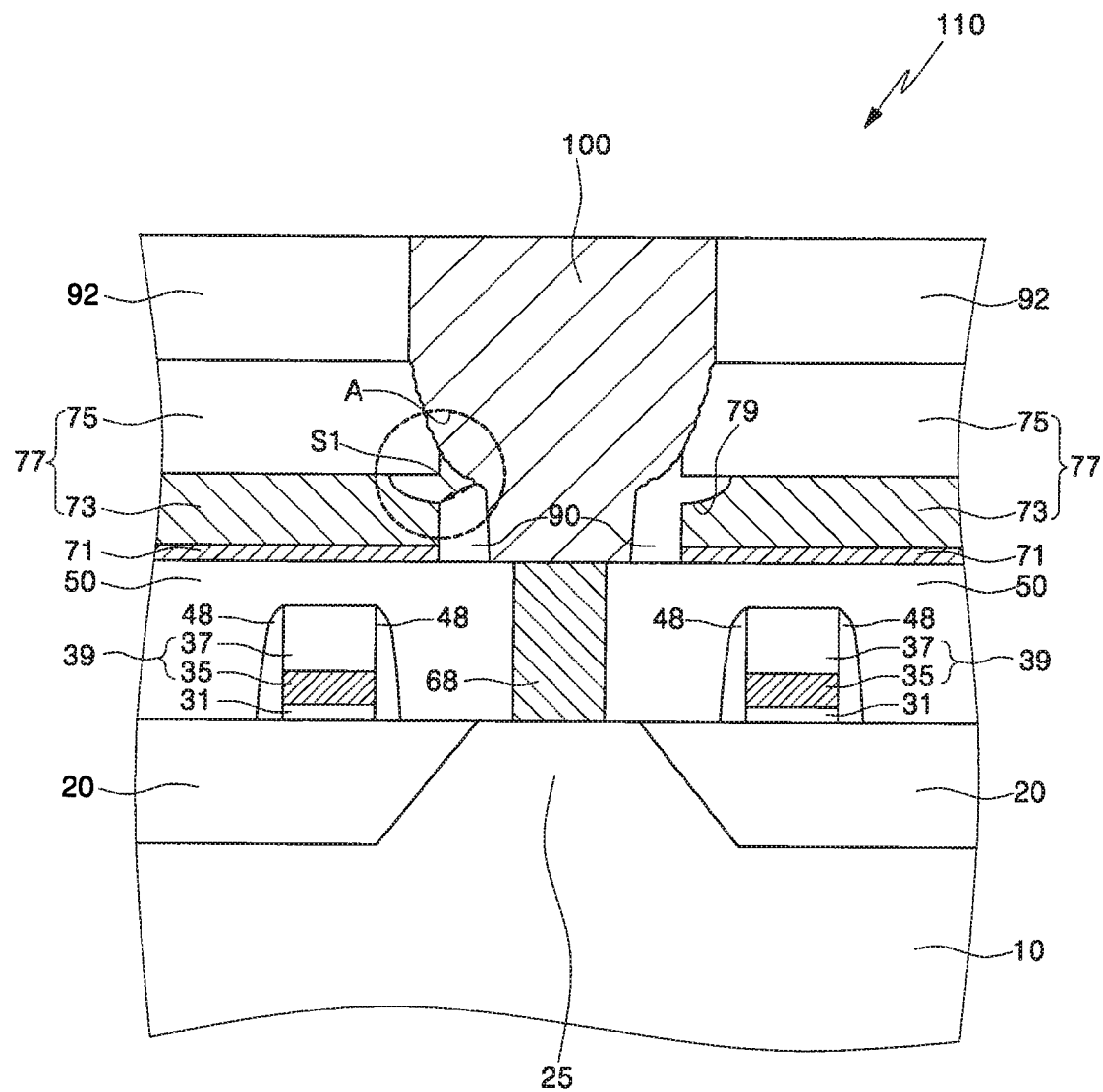
FIG. 2 is a cross-sectional view showing a semiconductor device taken along line I-I' of FIG. 1.

FIG. 1 is a layout showing a semiconductor device according to an embodiment of the invention, and FIG. 2 is a cross-sectional view showing the semiconductor device taken along line I-I' of FIG. 1.

Referring to FIGS. 1 and 2, two bit line patterns 77 are disposed on a semiconductor substrate 10 in a semiconductor device 110. Each of the bit line patterns 77 is composed of a bit line 73 and a bit line capping layer pattern 75, which are sequentially stacked. The bit line capping layer pattern 75 is preferably formed of a silicon nitride ($Si_3N_4$) layer. The bit line 73 is preferably a tungsten (W) layer.

Bit line spacers 90 are disposed on sidewalls of the bit line patterns 77. The bit line spacers 90 are preferably composed of an insulating layer having the same etching ratio as that of the bit line capping layer pattern 75. The bit line spacers 90 may be an insulating layer having an etching ratio different from that of a silicon oxide ($SiO_2$) layer. Each of the bit line spacers 90 covers a portion of the sidewall of the bit line capping layer pattern 75 and the entire sidewall of the bit line 73. Alternatively, one of the bit line spacers 90 may cover a portion of the sidewall of the bit line capping layer pattern 75 and the entire sidewall of the bit line 73 in just one of the bit line patterns 77, and the remaining bit line spacer 90 may cover the entire sidewalls of the bit line capping layer pattern 75 and the bit line 73 in the other bit line pattern 77.

A landing pad 100 is disposed between the bit line patterns 77. The landing pad 100 is preferably a conductive layer. The landing pad 100 may be an N-type polysilicon layer. Alternatively, the landing pad 100 may be composed of an N-type polysilicon layer and a metal layer, which are sequentially stacked. The landing pad 100 protrudes upward from upper surfaces of the bit line patterns 77. Also, the landing pad 100 is disposed to contact the bit line capping layer patterns 75, and spaced from the bit lines 73 with a predetermined distance S1. Therefore, the landing pad 100 is preferably insulated from the bit lines 73 with a predetermined minimum distance in a predetermined region A by the bit line spacer 90.

The structure in the bit line pattern region has trenches 79, facing a sidewall of the landing pad 100, between the bit line capping layer patterns 75 and the bit lines 73. The trenches 79 are each preferably filled with the bit line spacers 90. The width of an entrance of the respective trenches 79 is preferably different in size from the thickness of the respective bit line spacers 90 between the landing pad 100 and one of the bit lines 73. Alternatively, the width of the entrance of the respective trenches 79 may be equal in size to the thickness of the respective bit line spacers 90 between the landing pad 100 and one of the bit lines 73.

A planarized interlayer insulating layer 92 may be formed on the bit line capping layer patterns 75 to surround the landing pad 100. The planarized interlayer insulating layer 92 is preferably a silicon oxide layer including boron (B). The planarized interlayer insulating layer 92 may be an undoped silicate glass (USG) layer. The planarized interlayer insulating layer 92 may be a silicon oxide layer produced using plasma. Diffusion barrier layer patterns 71 may be disposed under the bit line patterns 77. The diffusion barrier layer patterns 71 are disposed around a lower portion of the landing pad 100. Each of the diffusion barrier layer patterns 71 is preferably composed of a titanium (Ti) layer and a titanium nitride (TiN) layer, which are sequentially stacked.

Gate patterns 39 may be disposed between the bit line patterns 77 and the semiconductor substrate 10, below the diffusion barrier layer patterns 71. Each of the gate patterns 39 includes a gate 35 and a gate capping layer pattern 37, which are sequentially stacked. The gate 35 is preferably composed of an N-type polysilicon layer and a metal silicide layer, which are sequentially stacked. Alternatively, the gate 35 may be composed of only an N-type polysilicon layer. The gate capping layer pattern 37 is preferably an insulating layer having the same etching ratio as that of the bit line capping layer pattern 75.

Further, gate insulating layer patterns 31 may be disposed under the gate patterns 39. The gate patterns 39 are disposed on an active region 25, which is isolated by a device isolation layer 20. The gate insulating layer patterns 31 are preferably a silicon oxide layer. Alternatively, the gate insulating layer patterns 31 may be a silicon oxynitride ($Si_xO_yN_z$) layer. Gate spacers 48 may be disposed on both sidewalls of the gate pattern 39, respectively. The gate spacers 48 are preferably an insulating layer having the same etching ratio as that of the gate capping layer pattern 37.

A buried landing pad 68 may be disposed between the gate patterns 39. The buried landing pad 68 is preferably formed using a conductive layer having the same conductivity type as that of the landing pad 100. A buried interlayer insulating layer 50 may be disposed to cover the gate pattern 39 and the gate spacers 48, and to surround the buried landing pad 68. The buried landing pad 68 is preferably disposed to connect the semiconductor substrate 10 and the landing pad 100. The buried interlayer insulating layer 50 is preferably an insulating layer having the same etching ratio as that of the planarized interlayer insulating layer 92.

FIGS. 3 to 15 are each cross-sectional views illustrating an embodiment of a method of forming the semiconductor device taken along line I-I' of FIG. 1. FIG. 16 is an enlarged cross-sectional view of a portion of FIG. 15.

Preferred embodiments are noted in the descriptions below. But embodiments of the invention are not limited to the details of these descriptions, which are only intended to illustrate some aspects.

Figure 3:
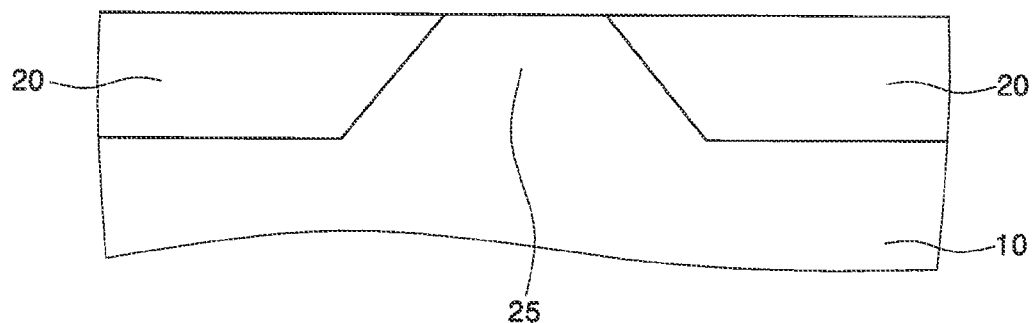
FIGS. 3 to 15 are cross-sectional views illustrating a method of forming a semiconductor device taken along line I-I' of FIG. 1.
Figure 4:
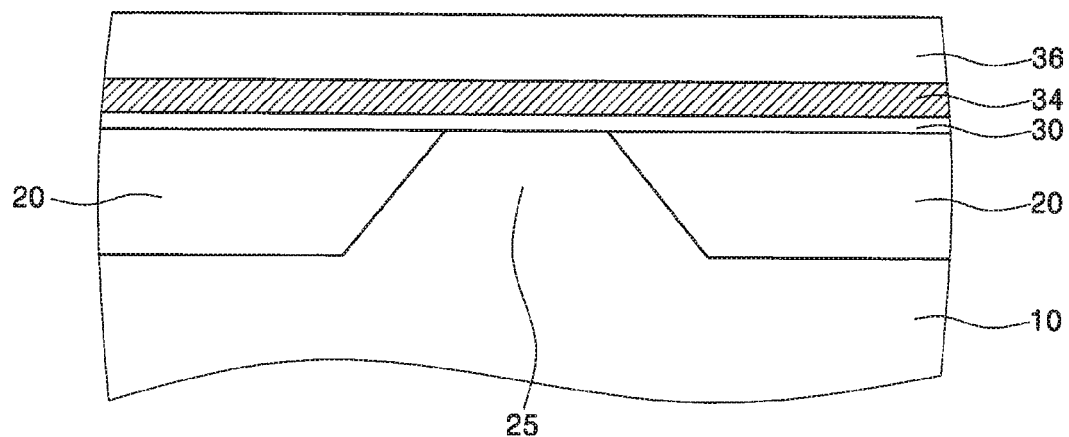
Figure 5:
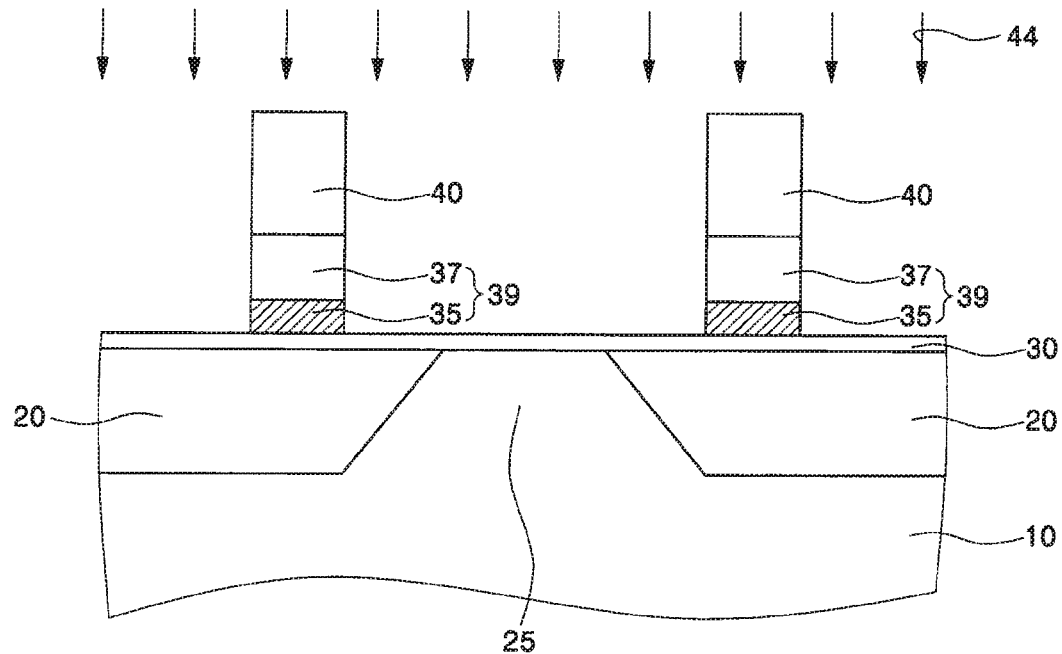

Referring to FIGS. 3 to 5, a device isolation layer 20 is formed in a semiconductor substrate 10. The device isolation layer 20 is preferably formed to isolate an active region 25. The device isolation layer 20 is preferably formed using at least one silicon nitride layer and at least one silicon oxide layer, which are sequentially stacked.

A gate insulating layer 30, a gate layer 34, and a gate capping layer 36 are sequentially formed on the semiconductor substrate 10. The gate capping layer 36 is preferably formed using a silicon nitride layer. The gate layer 34 is preferably formed using an N-type polysilicon layer and a metal silicide layer, which are sequentially stacked. Alternatively, the gate layer 34 may be formed using only an N-type polysilicon layer. The gate insulating layer 30 is preferably formed using a silicon oxide layer. Alternatively, the gate insulating layer 30 may be formed using a silicon oxynitride layer.

Photoresist patterns 40 are formed on the gate capping layer 36. The photoresist patterns 40 are preferably formed to have a line shape. An etch process 44 is sequentially performed on the gate capping layer 36, the gate layer 34, and the gate insulating layer 30, using the photoresist patterns 40 and the gate insulating layer 30 as an etch mask and an etch buffer layer, respectively. The etch process 44 forms gate patterns 39 between the photoresist patterns 40 and the gate insulating layer 30. Each of the gate patterns 39 is formed of a gate 35 and a gate capping layer pattern 37, which are sequentially stacked.

Figure 6:
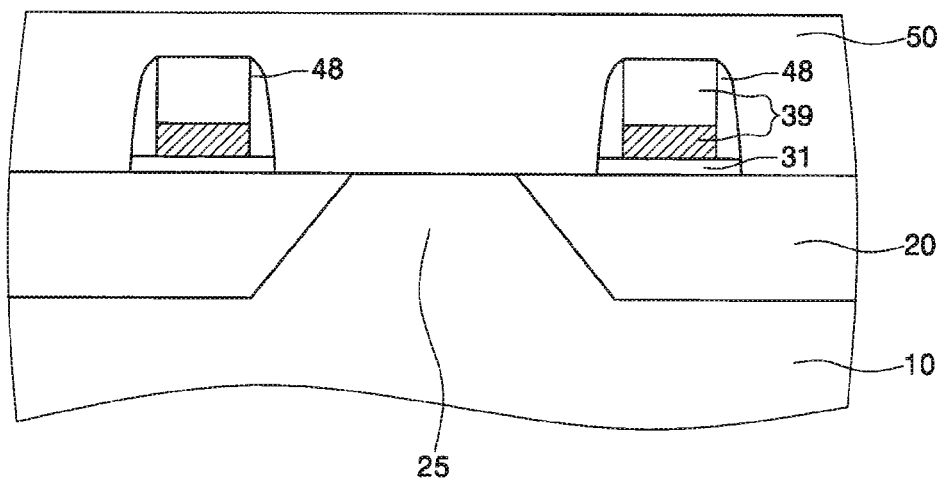
Figure 7:
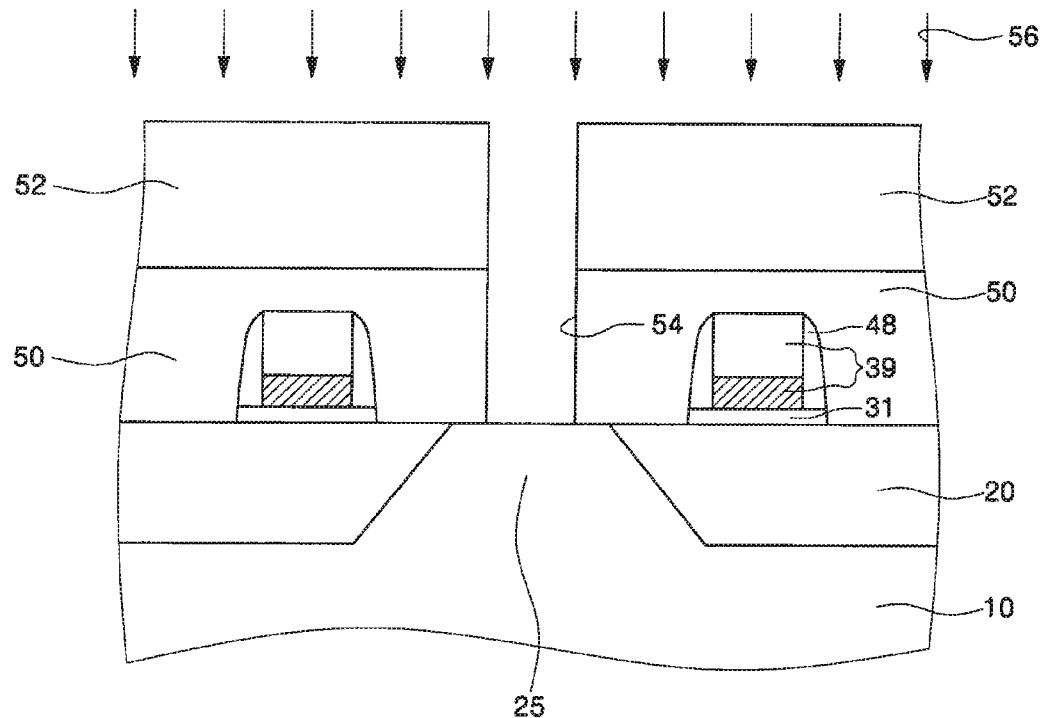

Referring to FIGS. 6 and 7, the photoresist patterns 40 are removed from the semiconductor substrate 10. Gate spacers 48 are formed on sidewalls of each of the gate patterns 39. The gate spacers 48 are formed to expose the semiconductor substrate 10. A buried interlayer insulating layer 50 is formed on the semiconductor substrate 10 to cover the gate patterns 39 and the gate spacers 48. The buried interlayer insulating layer 50 is preferably formed using a silicon oxide layer including boron (B). The buried interlayer insulating layer 50 may be formed using an undoped silicate glass (USG) layer. The buried interlayer insulating layer 50 may be formed of a silicon oxide layer using plasma.

A photoresist layer 52 is formed on the buried interlayer insulating layer 50. The photoresist layer 52 is preferably formed to have an opening. The opening is preferably formed between the gate patterns 39. An etch process 56 is performed on the buried interlayer insulating layer 50 through the opening, using the photoresist layer 52 as an etch mask. The etch process 56 forms a buried hole 54 penetrating the buried interlayer insulating layer 50 to expose the semiconductor substrate 10. The etch process 56 is preferably performed anisotropically.

Figure 8:
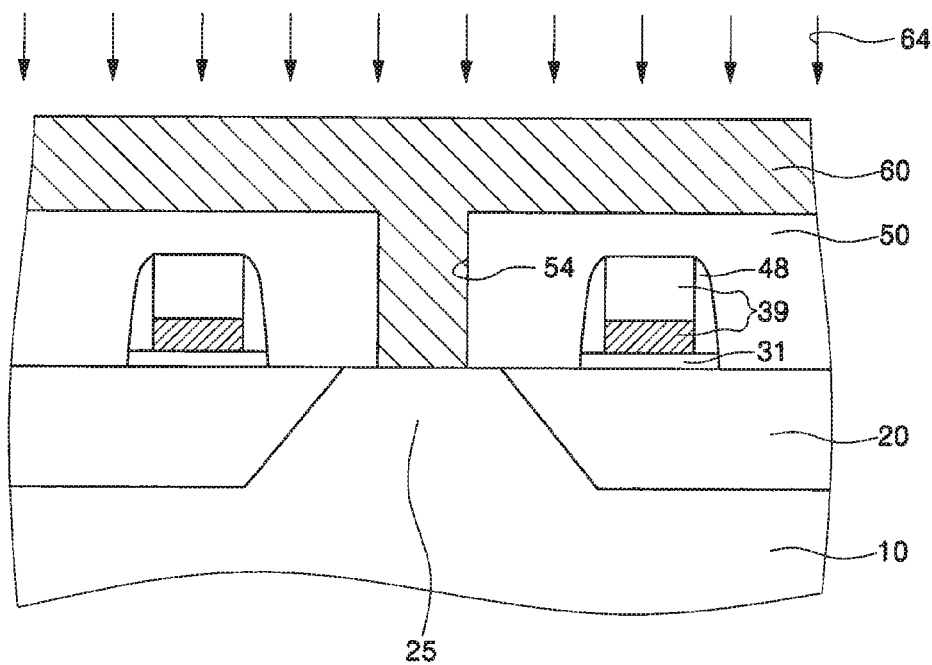
Figure 9:
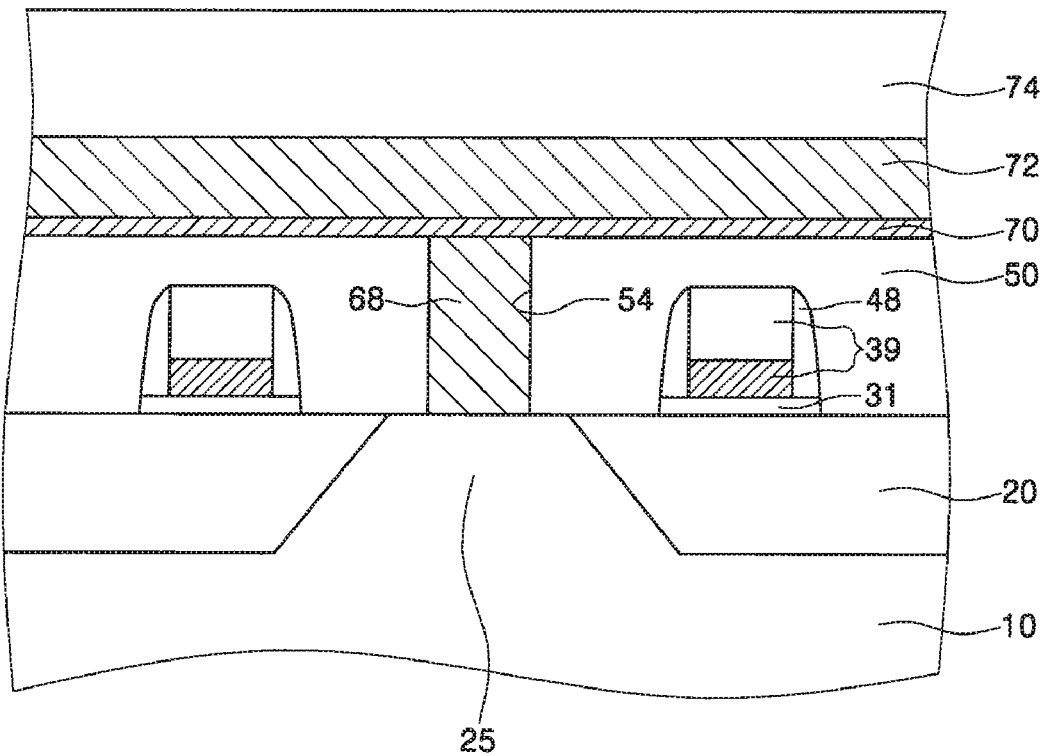

Referring to FIGS. 8 and 9, the photoresist layer 52 is removed from the semiconductor substrate 10. Then a buried landing pad layer 60 is formed on the buried interlayer insulating layer 50 to fill the buried hole 54. The buried landing pad layer 60 is preferably formed of an N-type polysilicon layer. An etch process is performed on the buried landing pad layer 60. The etch process 64 forms a buried landing pad 68 filling the buried hole 54. The etch process 64 may be performed using a chemical mechanical polishing (CMP) technology or an etching back technology.

A diffusion barrier layer 70, a bit line layer 72, and a bit line capping layer 74 are sequentially formed on the buried interlayer insulating layer 50 to cover the buried landing pad 68. The bit line capping layer 74 is preferably formed of an insulating layer having the same etching ratio as that of the gate spacer 48. The bit line layer 72 is preferably formed of a tungsten layer (W). The diffusion barrier layer 70 is preferably formed using a titanium layer (Ti) and a titanium nitride layer (TiN), which are sequentially stacked.

Figure 10:
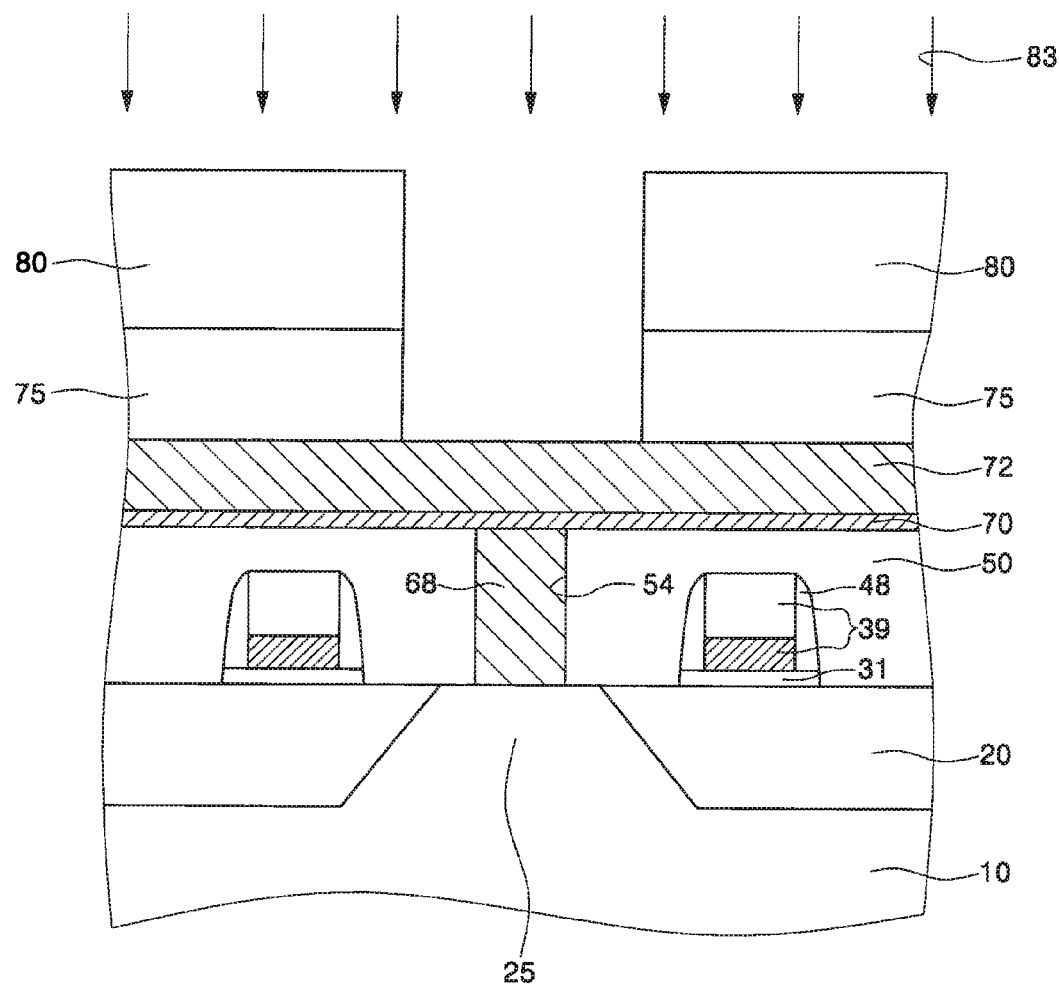
Figure 11:
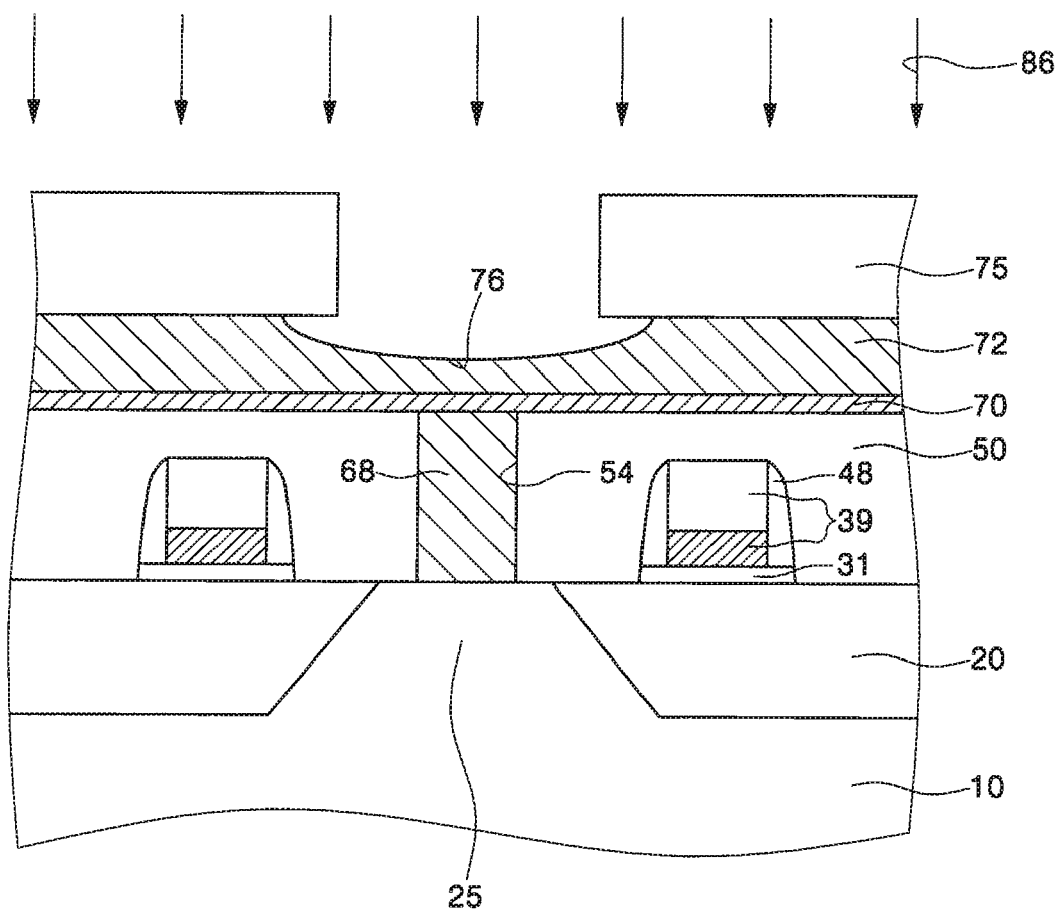

Referring to FIGS. 10 and 11, photoresist patterns 80 are formed on the bit line capping layer 74. The photoresist patterns 80 are preferably formed with a line shape. An etch process 83 is performed on the bit line capping layer 74, using the photoresist patterns 80 as an etch mask. The etch process 83 forms bit line capping layer patterns 75 on the bit line layer 72. The etch process 83 is preferably performed anisotropically.

After the bit line capping layer patterns 75 are formed, the photoresist patterns 80 are removed from the semiconductor substrate 10. An etch process 86 is continuously performed on the bit line layer 72, using the bit line capping layer patterns 75 as an etch mask. The etch process 86 forms a groove 76 in the bit line layer 72 between, and perhaps also under a portion of, the bit line capping layer patterns 75. The etch process 86 is preferably performed using an etchant including sulfuric acid ($H_2SO_4$) and hydrogen peroxide ($H_2O_2$). The etch process 86 is preferably performed isotropically.

Figure 12:
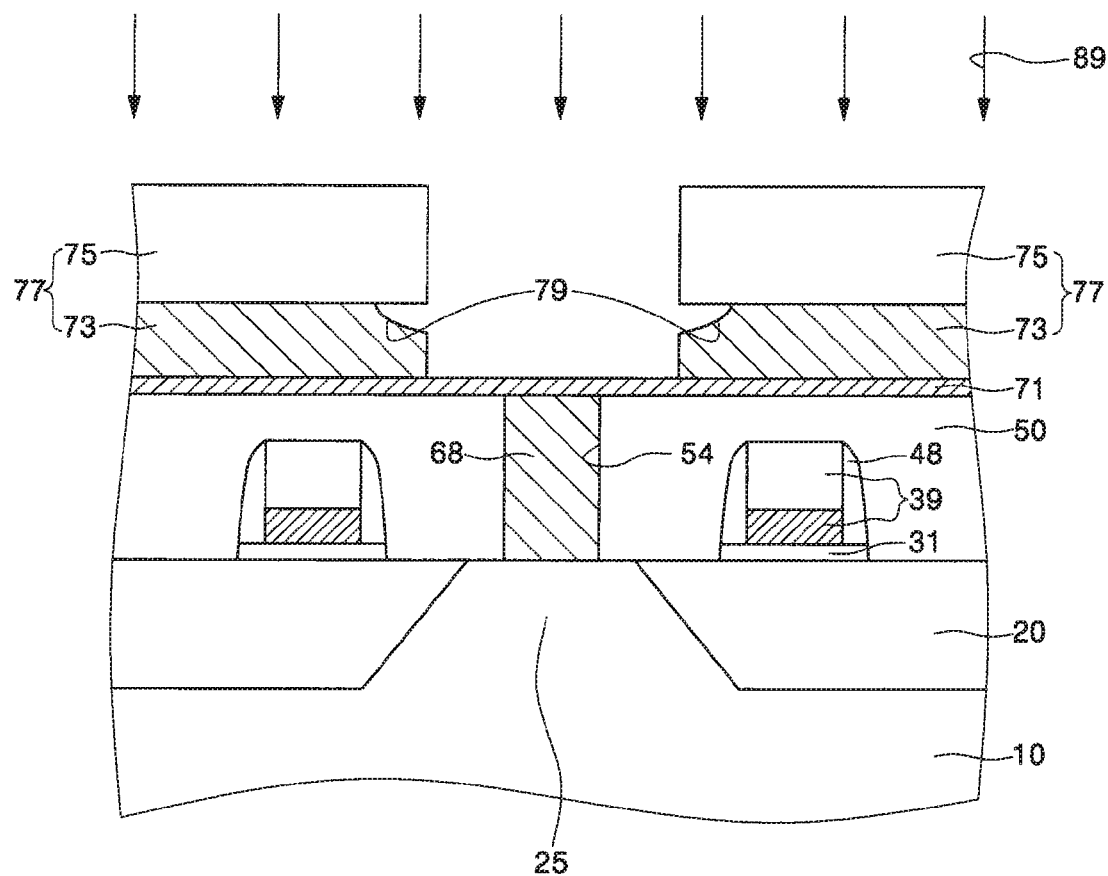
Figure 13:
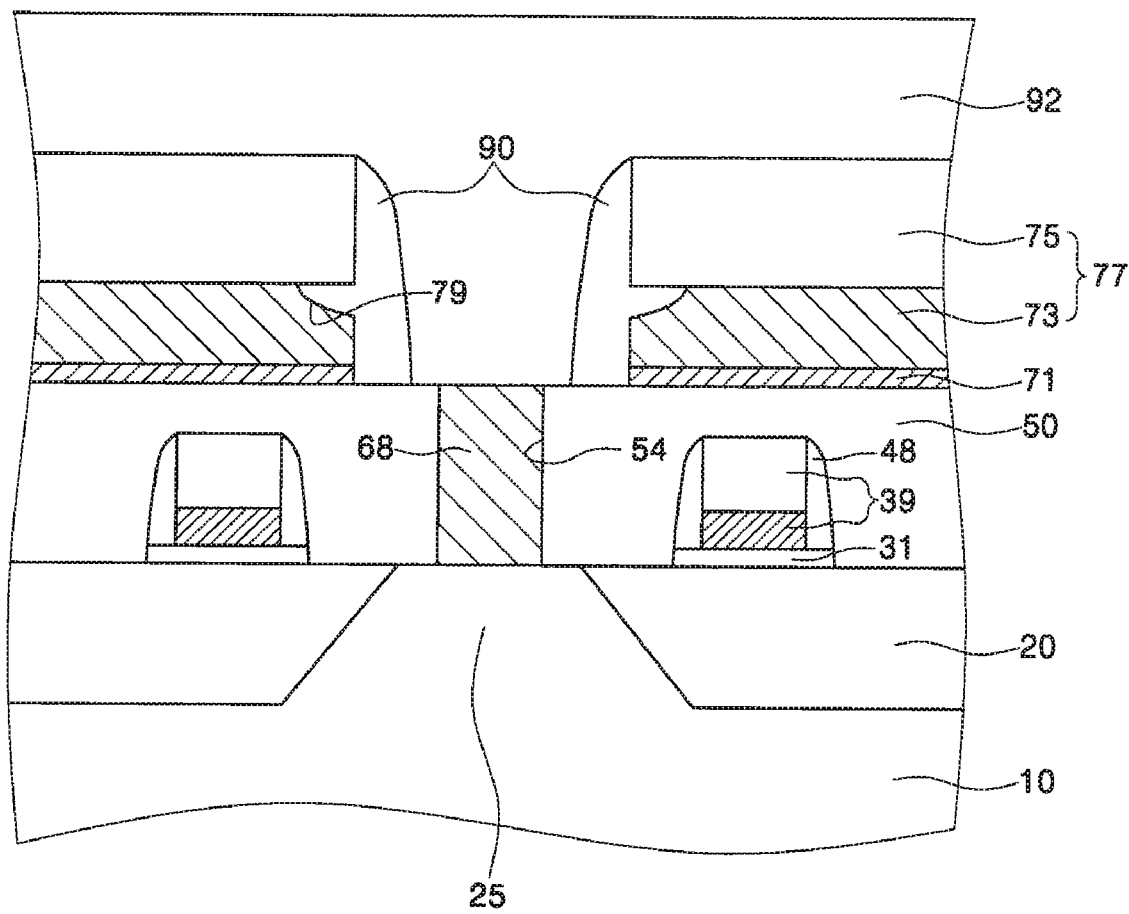

Referring to FIGS. 12 and 13, an etch process 89 is performed on the bit line layer 72 and the diffusion barrier layer 70 sequentially, using the bit line capping layer patterns 75 as an etch mask. The etch process 89 forms bit lines 73 and diffusion barrier layer patterns 71 under the bit line capping layer patterns 75. The etch process 89 forms trenches 79 between the bit line capping layer patterns 75 and the bit lines 73, using the groove 76 of the bit line layer 72 of FIG. 11. The etch process 89 is preferably performed until the buried landing pad 68 and the buried interlayer insulating layer 50 are exposed. Each of the bit lines 73 and each of the bit line capping layer patterns 75 are sequentially stacked, thereby forming a bit line pattern 77. The etch process 89 is preferably performed anisotropically.

Bit line spacers 90 are formed on sidewalls of the bit line pattern 77. The bit line spacers 90 are preferably formed using an insulating layer having the same etching ratio as that of the bit line capping layer pattern 75. Alternatively, the bit line spacers 90 may be formed of an insulating layer having an etching ratio different from that of a silicon oxide layer. The bit line spacers 90 are formed to fill the trenches 79, respectively. A width of an entrance of the respective trenches 79 is formed to be different in size from a thickness of the respective bit line spacers 90 facing the sidewall of the respective bit lines 73. Alternatively, the width of the entrance of the respective trenches 79 may be formed to be equal in size to a thickness of the respective bit line spacers 90 facing the sidewall of the respective bit lines 73. Then a planarized interlayer insulating layer 92 is formed on the buried interlayer insulating layer 50 to fully fill between the bit line patterns 77. The planarized interlayer insulating layer 92 is preferably formed of an insulating layer having the same etching ratio as that of the buried interlayer insulating layer 50.

Figure 14:
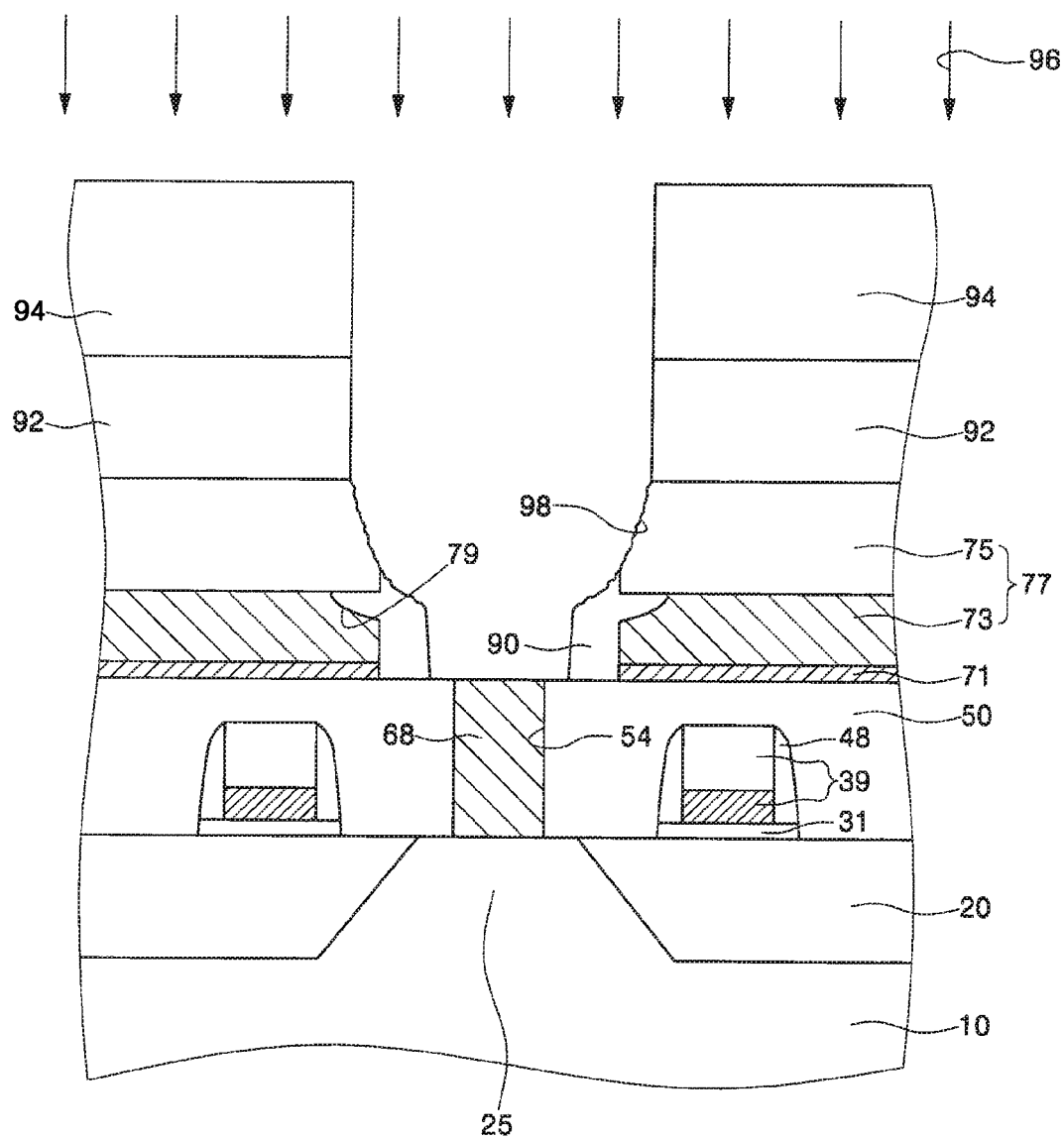
Figure 15:
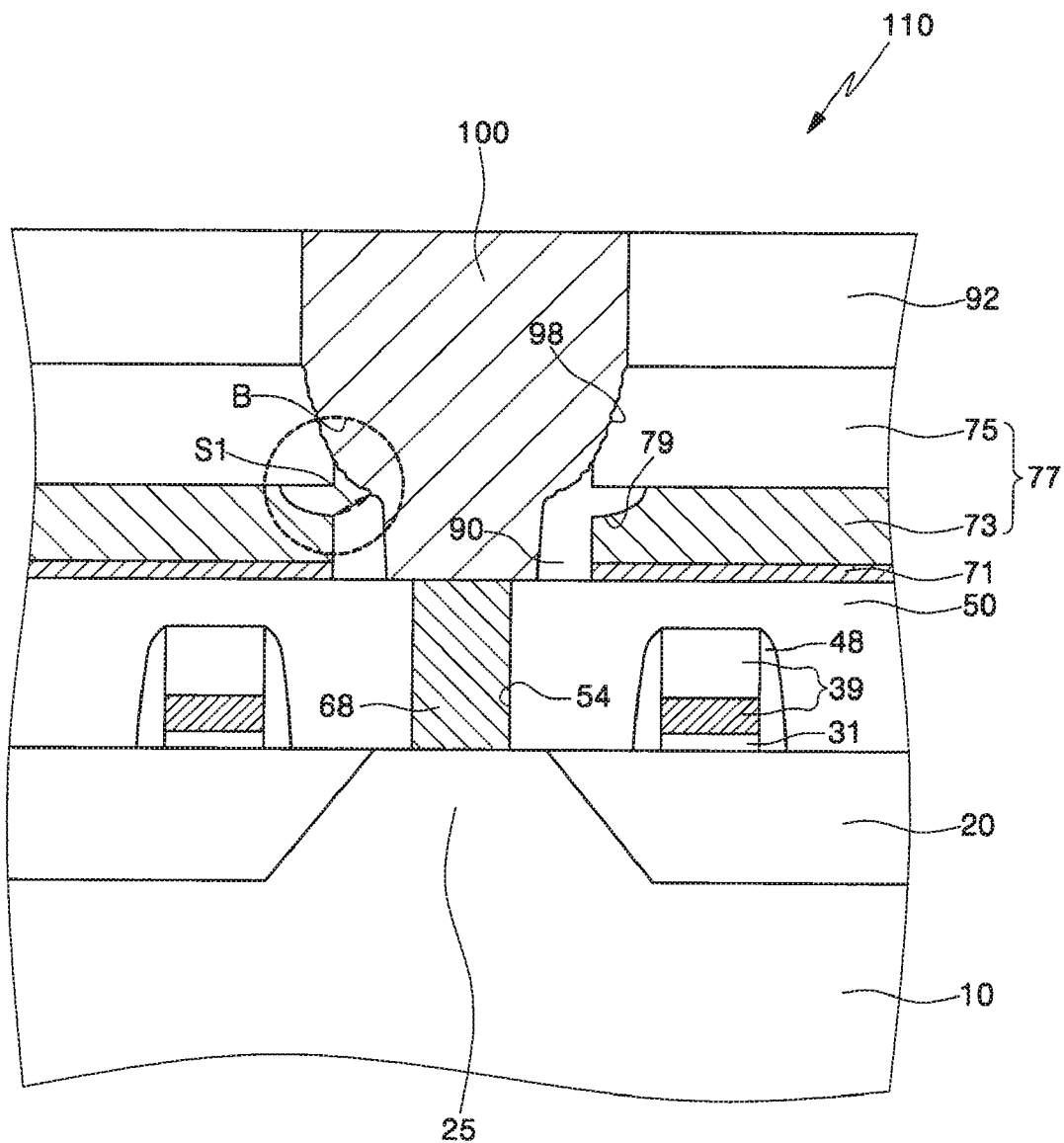
Figure 16:
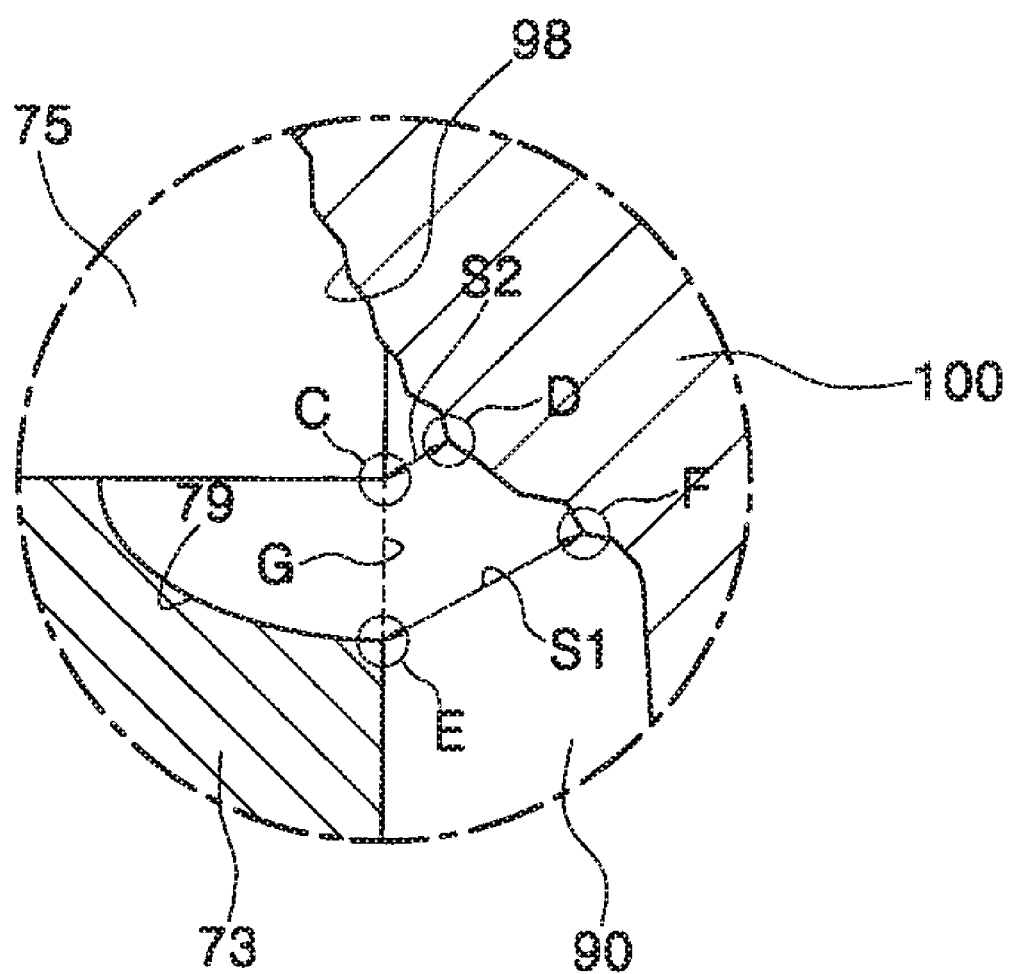
FIG. 16 is an enlarged cross-sectional view of a portion of FIG. 15.

Referring to FIGS. 14 to 16, a photoresist layer 94 is formed on the planarized interlayer insulating layer 92. The photoresist layer 94 is preferably formed to have an opening. The opening is preferably formed between the bit line patterns 77. An etch process 96 is performed on the planarized interlayer insulating layer 92 through the opening, using the photoresist layer 94 as an etch mask. The etch process 96 forms a pad hole 98 exposing the buried landing pad 68 between the bit line patterns 77.

On the other hand, the etch process 96 partially removes the bit line capping layer patterns 75 and the bit line spacers 90. Thus, the pad hole 98 simultaneously exposes the bit line capping layer patterns 75 and the bit line spacers 90 around the trenches 79. Alternatively, the pad hole 98 may expose the bit line capping layer pattern 75 and the bit line spacer 90, which are adjacent to one of the trenches 79. Further, the etch process 96 is preferably performed to have etching ratios different from each other with respect to the planarized interlayer insulating layer 92, the bit line capping layer patterns 75 and the bit line spacers 90. Thus, the pad hole 98 is formed to have different diameters in its upper portion and lower portion, respectively. The bit line spacers 90 remain around a lower portion of the pad hole 98 by the performance of the etch process 96, as shown in FIG. 14.

If, however, the pad hole 98 exposes the bit line capping layer pattern 75 and the bit line spacer 90 adjacent to one of the trenches 79, the situations is as follows. One of the bit line spacers 90 may cover a portion of the sidewall of the bit line capping layer pattern 75 and the entire sidewall of the bit line 73 in one of the bit line patterns 77, and the other bit line spacer 90 may cover the entire sidewalls of the bit line capping layer pattern 75 and the bit line 73 in the other bit line pattern 77.

After the formation of the pad hole 98, the photoresist patterns 94 are removed from the semiconductor substrate 10 as shown in FIG. 15. A landing pad 100 is formed to fill the pad hole 98. The landing pad 100 is preferably formed of a conductive layer having the same conductivity type as that of the buried landing pad 68. The landing pad 100 is formed to be spaced from the bit line 73 with a predetermined distance S1 as shown in a region B. As such, a semiconductor device 110, has the trenches 79 in the bit line patterns 77. This is explained in more detail as follows, referring to FIG. 16.

Before the explanation, a few definitions will now be made. First, a vertical line G is defined that virtually extends between the sidewalls of the bit line capping layer pattern 75 and the bit line 73. In other words, line G is an imaginary line that is defined to linearly connect the sidewalls of the bit line capping layer pattern 75 and the bit line 73. Second, points C and E are defined to be on this line G. Third, points D and F are defined to be on the bit line spacer 90.

Proceeding with the explanation, if the trench 79 does not exist between the bit line capping layer pattern 75 and the bit line 73, the landing pad 100 may be formed to be spaced from the bit line 73 using the bit line spacer 90 as an isolating layer, as long as a predetermined distance S2 from point C to point D corresponds to the minimum distance between the bit line capping layer pattern 75 and the landing pad 100 through the bit line spacer 90. This results in a structure that is not suitable for preventing an electrical short between the bit line 73 and the landing pad 100.

If, however, the trench 79 does exist between the bit line capping layer pattern 75 and the bit line 73, then the landing pad 100 is formed to be spaced from the bit line 73 using the bit line spacer 90 as the isolating layer, as long as the predetermined distance S1 from point E to point F corresponds to the minimum distance between the bit line 73 and the landing pad 100 through the bit line spacer 90. This provides a structure suitable for preventing an electrical short between the bit line 73 and the landing pad 100. Therefore, the trenches 79 can prevent an electrical short between the bit lines 73 and the landing pads 100 throughout an entire surface of the semiconductor substrate 10 despite an unstable semiconductor fabrication process.

In other words, without the trench 79, the minimum distance S2 between the bit line 73 and the landing pad 100 is less than that of S1 with the presence of the trench 79.

As described above, the invention provides a structure in which trenches are formed in the sidewalls of the bit line patterns to help prevent an electrical short between the bit lines and the landing pads. A summary of some embodiments of the invention will now be described in a non-limiting way.

Embodiments of the invention provide semiconductor devices having a trench in a side portion of a line pattern and methods of forming the same.

According to some embodiments of the invention, there are provided semiconductor devices having a trench in a side portion of a line pattern that includes two line patterns disposed on a semiconductor substrate. Each line pattern includes a line and a line capping layer pattern stacked thereon. Line spacers are disposed between the line patterns. One line spacer covers a portion of a sidewall of the line capping layer pattern and an overall sidewall of the line in one of the line patterns. And the remaining line spacer covers overall sidewalls of the line capping layer pattern and the line in the remaining line pattern. A landing pad is disposed between the line patterns and protrudes upward from upper surfaces of the line patterns. At this time, the landing pad is disposed to contact the line capping layer pattern and spaced from the line with a predetermined distance. And each of the line patterns has a trench, which faces a sidewall of the landing pad, between the line capping layer pattern and the line. And the line includes a tungsten layer.

According to some embodiments of the invention, there are provided methods of forming semiconductor devices having a trench in a side portion of a line pattern that include forming a line layer, a line capping layer and photoresist patterns sequentially stacked on a semiconductor substrate. The line layer may be formed of a tungsten layer (W). An etch process is performed on the line capping layer, using the photoresist patterns as an etch mask, thereby forming line capping layer patterns on the line layer. The photoresist patterns are removed from the semiconductor substrate. Another etch process is performed on the line layer, using the line capping layer patterns as an etch mask, thereby forming a groove in the line layer between the line capping layer patterns. Still another etch process is performed on the line layer, using the line capping layer patterns as an etch mask, thereby forming lines under the line capping layer patterns respectively. Each of the lines and the line capping layer patterns is sequentially stacked to form a line pattern. Line spacers are formed on sidewalls of the line patterns, respectively. A planarized interlayer insulating layer is formed on the line capping layer pattern to fully fill between the line patterns. A pad hole penetrates a predetermined portion of the planarized interlayer insulating layer between the line patterns. At this time, still another etch process forms trenches between the line capping layer patterns and the lines, using the groove of the line layer. The another etch process is performed using an etchant including sulfuric acid ($H_2SO_4$) and hydrogen peroxide ($H_2O_2$). The pad hole exposes the bit line capping layer pattern and the bit line spacer, which are adjacent to one of the trenches. And the line spacers fill the trenches, respectively.

What is claimed is:

1. A method of forming a semiconductor device comprising:
    forming a conducting line layer, a conducting line capping layer, and photoresist patterns, sequentially stacked on a semiconductor substrate;
    performing a first etch process on the conducting line capping layer, using the photoresist patterns as an etch mask, thereby forming conducting line capping layer patterns on the conducting line layer;
    removing the photoresist patterns from the semiconductor substrate;
    performing a second etch process on the conducting line layer, using the conducting line capping layer patterns as an etch mask, thereby forming a groove in the conducting line layer between the conducting line capping layer patterns, wherein the groove extends partially under the conducting line capping layer patterns to form a trench between the conducting line capping layer patterns and the conducting line layer;
    performing a third etch process on the conducting line layer, using the conducting line capping layer patterns as an etch mask, thereby forming conducting lines under the conducting line capping layer patterns respectively, each of the conducting lines and the conducting line capping layer patterns being sequentially stacked to form conducting line patterns, respectively;
    forming conducting line spacers on sidewalls of the conducting line patterns, respectively;
    forming a planarized interlayer insulating layer on the conducting line capping layer pattern to completely fill between the conducting line patterns; and
    forming a pad hole that penetrates a predetermined portion of the planarized interlayer insulating layer between the conducting line patterns, wherein
    the pad hole exposes the conducting line capping layer patterns and the conducting line spacers, and the conducting line spacers fill the trenches, respectively.

2. The method according to claim 1, wherein the first and third etch processes are performed anisotropically.

3. The method according to claim 1, wherein the second etch process is performed isotropically.

4. The method according to claim 1, wherein the formation of the pad hole comprises:
    forming a photoresist pattern having an opening between the conducting line patterns to expose the planarized interlayer insulating layer; and
    performing an etch process on the planarized interlayer insulating layer, the conducting line capping layer patterns and the conducting line spacer, using the photoresist patterns as an etch mask.

5. The method according to claim 1, wherein the conducting line spacers are formed using an insulating layer having an etching ratio different from that of a silicon oxide layer ($SiO_2$).

6. The method according to claim 1, wherein the conducting line capping layer patterns are formed using an insulating layer having the same etching ratio as that of the conducting line spacers.

7. The method according to claim 1, wherein a width of the open end of each of the respective trenches is formed to have a different size from the minimum thickness of the respective conducting line spacers.

8. The method according to claim 1, wherein a width of the open end of the respective trenches is formed to have an equal size to the minimum thickness of the respective conducting line spacers.

9. The method according to claim 1, further comprising:
    forming a landing pad between the conducting line patterns to fully fill the pad hole;
    forming diffusion barrier layer patterns under the conducting line patterns; and
    forming other conducting line patterns below the diffusion barrier layer patterns to be disposed between the conducting line patterns and the semiconductor substrate, each of the other conducting line patterns including other conducting line and other conducting line capping layer pattern stacked thereon, wherein the other conducting line is formed using an N-type polysilicon layer and a metal silicide layer stacked thereon, and the other conducting line capping layer pattern is formed to have the same etching ratio as that of the conducting line capping layer pattern.

10. The method according to claim 9, wherein the diffusion barrier layer pattern is formed using titanium (Ti) and titanium nitride (TiN) stacked thereon.

11. The method according to claim 9, further comprising:
forming a buried landing pad between the other conducting line patterns; and
forming a buried interlayer insulating layer to surround the buried landing pad and to cover the other conducting line patterns, wherein
the buried landing pad is formed to connect the semiconductor substrate and the landing pad.

12. The method according to claim 11, wherein the buried landing pad is formed using a conductive layer having the same conductivity type as that of the landing pad.

13. The method according to claim 1, wherein the conducting line layer includes a tungsten layer.

14. The method according to claim 1, wherein the second etch process is performed using an etchant including sulfuric acid ($H_2SO_4$) and hydrogen peroxide ($H_2O_2$).

15. A method of forming a semiconductor device comprising:
forming a conducting line layer and conducting line capping layers, sequentially stacked on a semiconductor substrate;
forming a groove in the conducting line layer between consecutive conducting line capping layers, wherein the groove extends partially under the consecutive conducting line capping layers to form a trench between each of the conducting line capping layers and the conducting line layer;
forming conducting lines under the conducting line capping layers by etching the conducting line layer, each of the conducting lines and the conducting line capping layers being sequentially stacked to form conducting line patterns, respectively;
forming a spacer on a sidewall of the conducting line patterns to fill the trench; and
forming a conducting landing pad adjacent, and contacting, the spacer, wherein the conducting landing pad is spaced from each of the conducting lines by a minimum distance through the spacer, and wherein the minimum distance is increased by the presence of the trench.

16. The method according to claim 15, wherein forming the groove includes isotropic etching.

* * * * *